United States Patent [19]
Stålmarck

[11] Patent Number: 5,276,897
[45] Date of Patent: Jan. 4, 1994

[54] SYSTEM FOR DETERMINING PROPOSITIONAL LOGIC THEOREMS BY APPLYING VALUES AND RULES TO TRIPLETS THAT ARE GENERATED FROM BOOLEAN FORMULA

[76] Inventor: Gunnar M. N. Stålmarck, Sländvägen, 20, S-125 33 Älvsjö, Sweden

[21] Appl. No.: 537,937

[22] Filed: Jun. 14, 1990

[30] Foreign Application Priority Data

Jun. 16, 1989 [SE] Sweden ............................. 8902191

[51] Int. Cl.⁵ ..................... G06F 15/20; G06F 11/00
[52] U.S. Cl. .............................. 395/800; 364/221.7; 364/DIG. 1
[58] Field of Search ................... 395/800; 434/433

[56] References Cited

U.S. PATENT DOCUMENTS 4,504,236  3/1985  Zellweger .................... 434/433
4,698,751  10/1987  Parvin ........................ 395/800

FOREIGN PATENT DOCUMENTS 3043563   6/1982  Fed. Rep. of Germany.
01231166  3/1988  Japan.
0229857   7/1988  Japan.
WO86/06518 11/1986  World Int. Prop. O.

OTHER PUBLICATIONS

A higher-order implementation of rewriting, Paulson, L. Science of Computer programming vol. 3, No. 2, pp. 119–149, Aug. 1983.

Primary Examiner—Robert B. Harrell
Assistant Examiner—Meng-Ai T. An
Attorney, Agent, or Firm—Burns, Doane, Swecker & Mathis

[57] ABSTRACT

The invention relates to a method and apparatus for theorem checking with the intention in so-called tautology checks of establishing whether or not all possible attributions of the truth values (0 and 1) to variables in a boolean formula render the formula true. The problem of known techniques is that checking of the truth content is effected against all variables in an original formula, which requires many calculations to be made and which is highly time-consuming.

According to the invention, an original formula is divided into part-expressions, so-called triplets, each corresponding to a sub-formula of the original formula, whereafter logic 0's and 1's are instantiated (allotted) to variables in the triplets for the purpose of checking the truth content. The check is thus made against triplets instead of against all variables in the original formula, therewith greatly reducing the number of calculations necessary and providing a considerable saving in time. Apparatus, called a theorem checker, for carrying out the method includes a sequence unit for controlling the calculation sequence, a generator G for generating sequences of ordered variables, a permanent unit P for storing triplets, a plurality of arithmetical units, evaluators (E) and an analyzer A operative to analyze the result obtain from all calculations.

4 Claims, 14 Drawing Sheets

Fig. 6
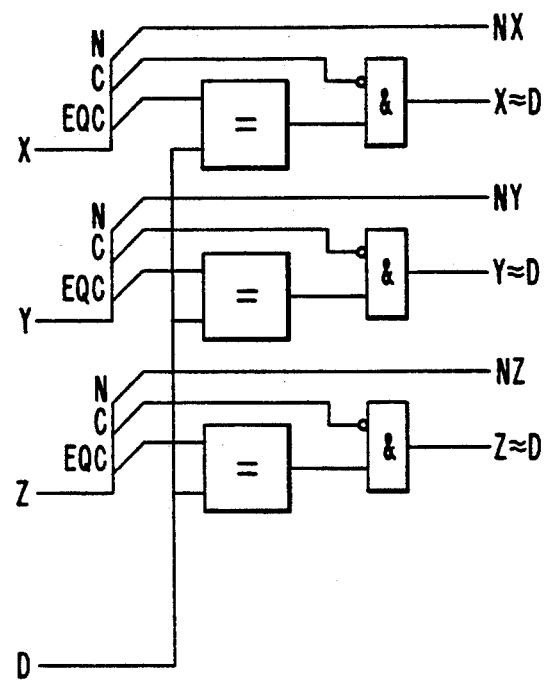
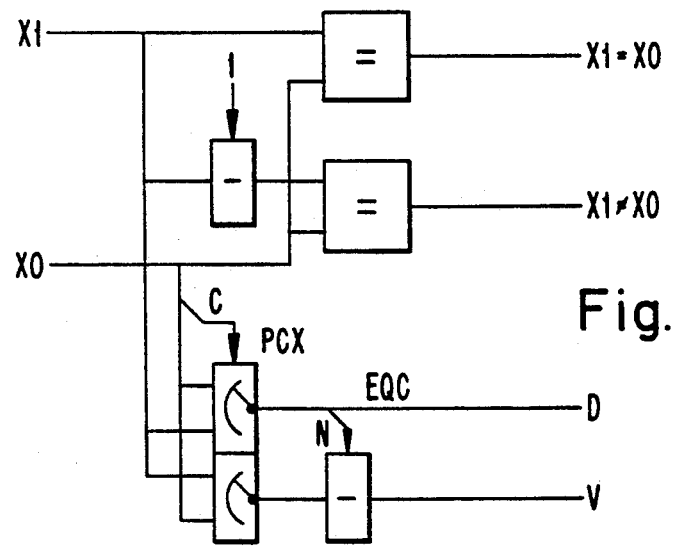
Fig. 7
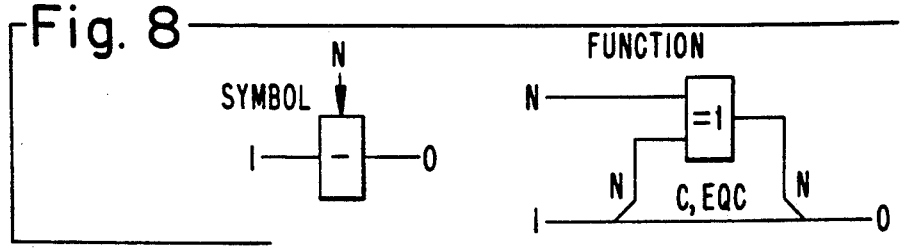
Fig. 8

SYSTEM FOR DETERMINING PROPOSITIONAL LOGIC THEOREMS BY APPLYING VALUES AND RULES TO TRIPLETS THAT ARE GENERATED FROM BOOLEAN FORMULA

TECHNICAL FIELD

The method and the apparatus according to the present invention are concerned with a solution to the problem of determining whether or not all possible assignments of the truth values (0 and 1) to variables in a boolean formula make the formula true, when carrying-out so-called tautology checks. The method can also be applied to solve the so-called satisfiability problem, which is the problem of deciding whether or not any assignment of the truth values to the variables included in a boolean formula make the formula true.

BACKGROUND ART

When practicing present day techniques, it is necessary to check the truth values for each assignment (interpretation) of 1 and 0 to the variables included in a formula.

The so-called resolution method can also be used in the case of simple systems. This method involves rewriting the original formula to a logic equivalent formula consisting of a number of parts which are mutually compared in accordance with the so-called resolution rule. When making a comparison between, for instance, an expression which contains A and an expression which does not contain A, this rule requires the formation of a new expression, a resolvent, which contains neither A nor not A. The concept is to find an expression which contains solely A and an expression which contains solely not A, wherewith when a comparison is made between these two expressions, there is formed an empty resolvent, which is the one sought.

DISCLOSURE OF THE INVENTION

The problem with present day techniques is that the test sequence is extremely time-consuming. When the number of variables is equal to N, the number of assignments possible will equal $2^N$. In the worst of cases, an equally as long period of time may be required to carry out the test, i.e., $2^N$ arithmetical steps.

When practicing the resolution method, an average case requires fewer comparisons to be made, although one serious problem is that because of the constant formation of new expressions, there is a risk that the method will not afford any improvement at all. Theoretical investigations have also shown that the resolution method is always exponential on certain formulae.

Two important observations which concern the invention are:

a) All tautology derivations (proofs) in Natural Deduction Systems (ND-system) can be written in a unique normal form which contains solely sub-formulae and negated sub-formulae of the formula to be proved.

b) The question of ascertaining whether or not a formula can be shown to be tautologous with a standard derivation (derivation of the normal form) of which all part-derivations contain at most a given number of N mutually-different free assumptions, can be calculated in polynomial time when practicing the inventive method.

The inventive method and apparatus are characterized in the following claims and solve the problem of an excessive number of time-consuming test sequences when checking the truth content of a formula. The problem is solved in accordance with the invention, by dividing the formula into part-expressions, so-called triplets, each containing three terms, and by subsequently assigning variables in the triplets to said truth values, logic 0's or 1's, for the purpose of checking the truth content thereof. This division into triplets enables effective arithmetical rules to be formulated for the purpose of calculating the truth content of part/expressions in the original formula. This will enable the truth content of the original formula to be calculated, without needing to analyze all combinations of the truth values of the variables of the original formula. Thus, checks are made against triplets instead of against all variables in the whole formula, therewith reducing considerably the number of test sequences required and achieving considerable time savings.

Apparatus for carrying out the method, referred to here as a theorem checker, contains a sequence unit S, a generator G, a permanent unit P, an analyzer A, and a number of evaluators (arithmetic units) E.

The sequence unit S is operative to determine which stage of the check shall be carried out at that particular moment in time. The generator G is operative to generate sequences of ordered variables so-called tuplets. The permanent unit P includes a memory for storing triplets, an instantiation part, and an analyzer part. The evaluator E is an arithmetical unit which is alone responsible for the calculations made in a test sequence.

The method can be used advantageously in all applications where, for instance, it is required to check whether or not a specification for a system is correct and whether or not realization in accordance with the specification is possible. The specification to be tested may be intended for both a hardware solution of a problem and a software solution.

In addition to time-saving, a further advantage afforded by the inventive method and the inventive apparatus is the ability to apply the invention to both small and large systems, and to both simple and complicated systems.

BRIEF DESCRIPTION OF THE DRAWINGS

The inventive method and apparatus will now be described in more detail with reference to an exemplifying embodiment illustrated in the accompanying drawings, in which

FIG. 6 is a block schematic of an instantiating part in the permanent unit P;

FIG. 7 is a block schematic of an analyzer part in the permanent unit P;

FIG. 8 is a block schematic of a negating element;

BEST MODES OF CARRYING OUT THE INVENTION

Figure 1:
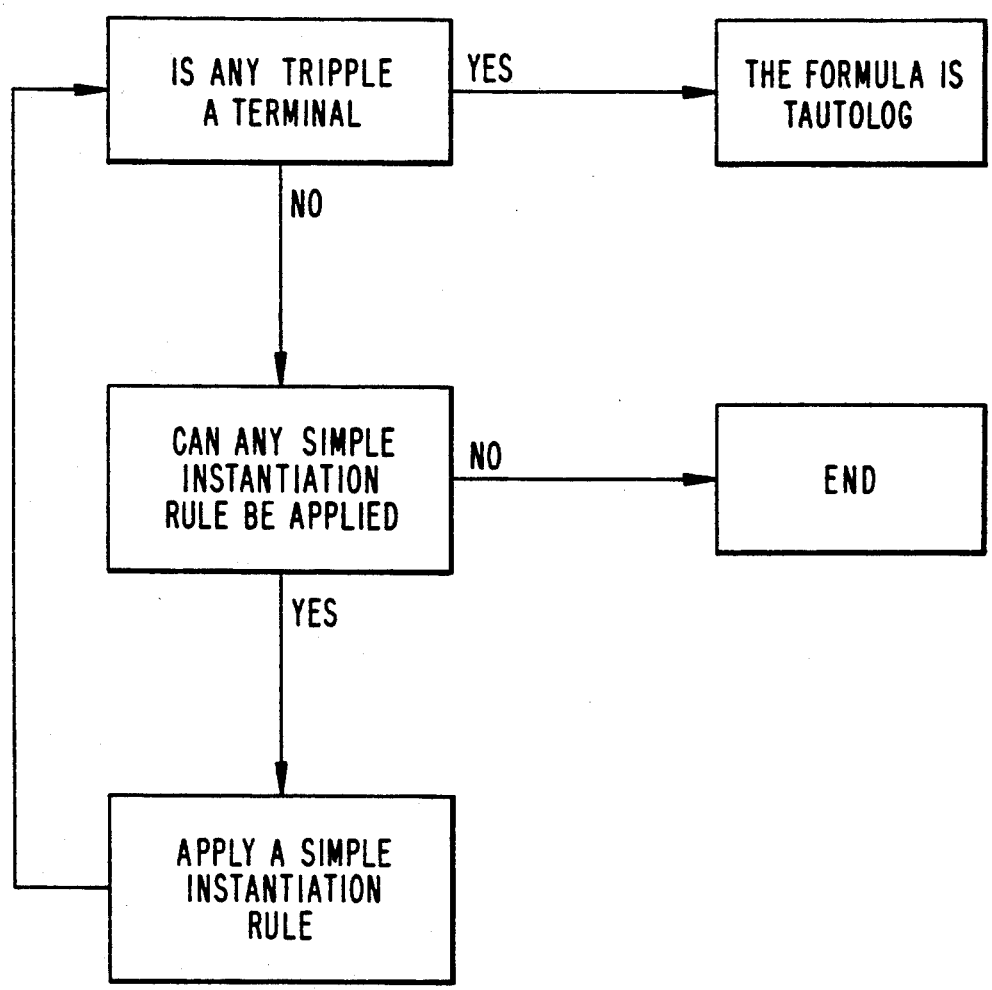
FIG. 1 is a flow chart illustrating an inventive sequence.

The inventive method can be divided into two phases:
a) Establishment of (data)-structures
b) Arithmetical phase

Establishment Phase

1. A formula to be tested is rewritten as a logical equivalent formula which, for instance, contains solely
   — > (implies) and
   — (the negation — A to a formula A is defined as (A— >0))
   as logical constants, for instance in accordance with the following rewriting rules:
   (A or B) is rewritten to (−A — > B)
   (A & B) is rewritten to — (A — > − B)
   (It is also prossible to use several boolean connectives, although in this case it is also necessary to introduce separate instantiating rules therefor.)
2. Let a1 ... an be all variables in A.
   Let B1 ... Bk be all compound sub-formulae to A and let Bi be (Ci —> Di) where Ci and Di are sub-formulae or A.
   Also, let y1 ... yk be "new" variables, such that yi differs from each ai, i.e. all new variables differ from each of the old variables.
   Let f be a function so that f(ai) = ai and f(Bi) = yi.

An Expression $M(A)=((y1<->(f(C1) \rightarrow f(D1)))$ & ... &$(yk<->f(Ck)->f(Dk))))$ is called the matrix of A, and a conjunction route $ti=(yi<->(f(Ci)->f(Di)))$ in a matrix is called a triplet, as previously mentioned. In order to simplify the description, M(A) is considered as a set of triplets (t1 ... tn) and a triplet $ti=(yi<->(f(Ci) \rightarrow f(Di)))$ is an ordered set (yi, f(Ci), f(Di)).

The Arithmetical Phase

The so-called arithmetical or calculating phase is initiated when the matrix M(A) has been established. Each compound sub-formula of the original formula A is found represented by a new variable in a triplet in the matrix M(A). If the convention is introduced of constantly allowing the whole of the formula A to be presented by the highest indexed triplet in M(A), i.e., if M(A)=(t1 ... tk), then the whole of A is represented by yk in tk=(yk, f(Ck), f(Dk)).

The example used to exemplify the invention is based on the assumption that 0-assignment represents falsehood and 1-assignment represents truth.

A fundamental property of a matrix M(A) is that when the formula A is tautologous, the definition of A "forces" the variable which represents A to be true. Expressed in formula terms:

If M(A)=(t1 ... tk), A is a tautology if, and only if, M(A)->yk is a tautology.
Expressed in another way:
If M(A)=(t1 ... tk), A is a tautology if, and only if, M(A) yk/0 is contradictory (where yk/0 signifies that a 0 has been assigned to the variable yk).

A tautology check of a formula A is effected essentially in the following manner:

(i) A matrix M(A)=(t1 ... tk) is established.
(ii) yk is assigned 0, i.e., it is assumed that the whole formula A is false.
(iii) Variables in M(A) are assigned the values according to given rules, until either a false triplet, a so-called terminal, occurs and the conclusion can be drawn that the formula A is tautologous, or until it is found that no arithmetical rule is applicable, therewith enabling the conclusion to be drawn that the formula A cannot be checked in the formal calculus selected for simulation.

Since the description includes a number of specialized expressions, an explanation of these expressions is given below.

A term always refers to a variable or to a constant, 0 or 1

A triplet always contains three (3) terms.
A matrix includes one or more triplets.
An atom is a term in an original formula as distinct from the new variables introduced into the matrix of a corresponding formula.
A terminal is a false triplet; when a terminal occurs the calculation or part-calculation is terminated.

Assume that an original formula is false. If a false triplet (terminal) occurs during the calculation, this shows that the original formula is true. A terminal is actually a triplet having a given, determined configuration.

In the following, there is given an example, in accordance with the invention, of calculating a formula with the aid of simple, predetermined instantiating rules. With the assumption that a triplet is true, it is possible to investigate with the aid of these rules 1–10 whether or not a variable in the triplet has been forced to have a given value in order for the triplet to be true.

Instantiating rules:

| | |
|---|---|
| M1 (X,Y,1) | M1 (X,0,Z) |
| 1. M2 | 2. M2 |
| M1 (1,Y,1) X/1 | M1 (1,0,Z) X/1 |
| M2 | M2 |
| M1 (X,Y,Y) | M1 (X,X,Y) |
| 3. M2 | 4. M2 |
| M1 (1,Y,Y) X/1 | M1 (1,1,1,) X/1, Y/1 |
| M2 | M2 |
| M1 (1,1,Z) | M1 (1,Y,0) |
| 5. M2 | 6. M2 |
| M1 (1,1,1) Z/1 | M1 (1,0,0) Y/0 |
| M2 | M2 |
| M1 (X,1,Z) | M1 (X,Y,0) |
| 7. M2 | 8. M2 |
| M1 (Z,1,Z) X/Z | M1 (−Y,Y,0) X/−Y |
| M2 | M2 (where −Y is the complement to Y) |
| M1 (X,1,0) | M1 (0,Y,Z) |
| 9. M2 | 10. M2 |
| M1 (0,1,0) X/0 | M1 (0,1,0) Y/1, Z/0 |

-continued

| M2 | M2 |
|---|---|

It can be said in explanation of the instantiation according to rule 1:

That if triplet (X,Y,1) is an element in a matrix M, the matrix M is reduced to M with the constant 1 substituted for the variable X.

Formulae to be calculated:

$$(p \xrightarrow{X_1} q) \xrightarrow{X_5} ((q \xrightarrow{X_2} r) \xrightarrow{X_4} (p \xrightarrow{X_3} r))$$

(i) The formula is rewritten to triplets and the variable which represents the whole formula, in accordance with the example the variable $X_5$ is instantiated to 0 (zero). It is assumed that the whole formula is false by instantiating to 0.

Triplet  t1 = $(X_1,p,q)$
       t2 = $(X_2,q,r)$
       t3 = $(X_3,p,r)$
       t4 = $(X_4,X_2,X_3)$
       t5 = $(0,X_1,X_4)$  The formula is assumed to be false $X_5=0$.

It should be mentioned that $X_1$-$X_5$ are not found in the original formula, but are the new variables corresponding to the composite part-formulae in the original formula. The location of $X_1$-$X_5$ indicates which sub formulae are represented by respective variables.

Examples are given of calculating the aforesaid formulae with the aid of the rules 1 ∝ 10, while referring to FIG. 1:

1a) No triplet is terminal
  b) Simple instantiating rule 10 can be applied on triplet t5 and gives the result:
    t1 (1,p,q) (which implies that 1 is substituted for $X_1$ in the matrix and 0 for $X_4$)
    t2 $(X_2,q,r)$
    t3 $(X_3,p,r)$
    t4 $(0,X_2,X_3)$
    t5 (0 1 0)
2a) No, no triplet is terminal
  b) Yes, a simple instantiating rule can be applied on t4 and gives the result:
    t1 (1,p,q)
    t2 (1,q,r)
    t3 (0,p,r)
    t4 (0,1,0)
    t5 (0,1,0)
3a) No, no triplet is terminal
  b) Yes, a simple instantiating rule 10 can be applied on t3 and gives the result:
    t1 (1,1,q)
    t2 (1,q,0)
    t3 (0,1,0)
    t4 (0,1,0)
    t5 (0,1,0)
4a) No, no triplet is terminal
  b) Yes, a simple instantiating rule can be applied on triplet t1 and gives the result:
    t1 (1,1,1)
    t2 (1,1,0)
    t3 (0,1,0)
    t4 (0,1,0)
    t5 (0,1,0)
5 The triplet t2 is found to be a terminal. The formula is thus tautologous.

Test instantiating, i.e., tests with 1's and 0's are not required in this case, simple instantiating rules suffice.

When it is not possible to carry-out calculations with the aid of simple instantiating rules, test instantiations can be effected, as before mentioned, with the aid of ones (1) and zeros (0). Thus, ones (1) and zeros (0) are assigned to one or more non-instantiated variables in the matrix for each possible combination of ones (1) and zeros (0) of these variables. The simple instantiating rules are then applied for each of the possible combinations, until none of such rules can be applied any longer. The result obtained from this application of the simple instantiating rules on the matrix for each of the separate combinations is saved temporarily for comparison purposes. The various results (value assignments to variables) are compared and analyzed. The results common to each of the test cases are saved permanently and the remaining temporarily saved results are erased from the memory. Calculations made in accordance with this method are repeated until is obtained a result which is acceptable for the practical application concerned.

Figure 2:
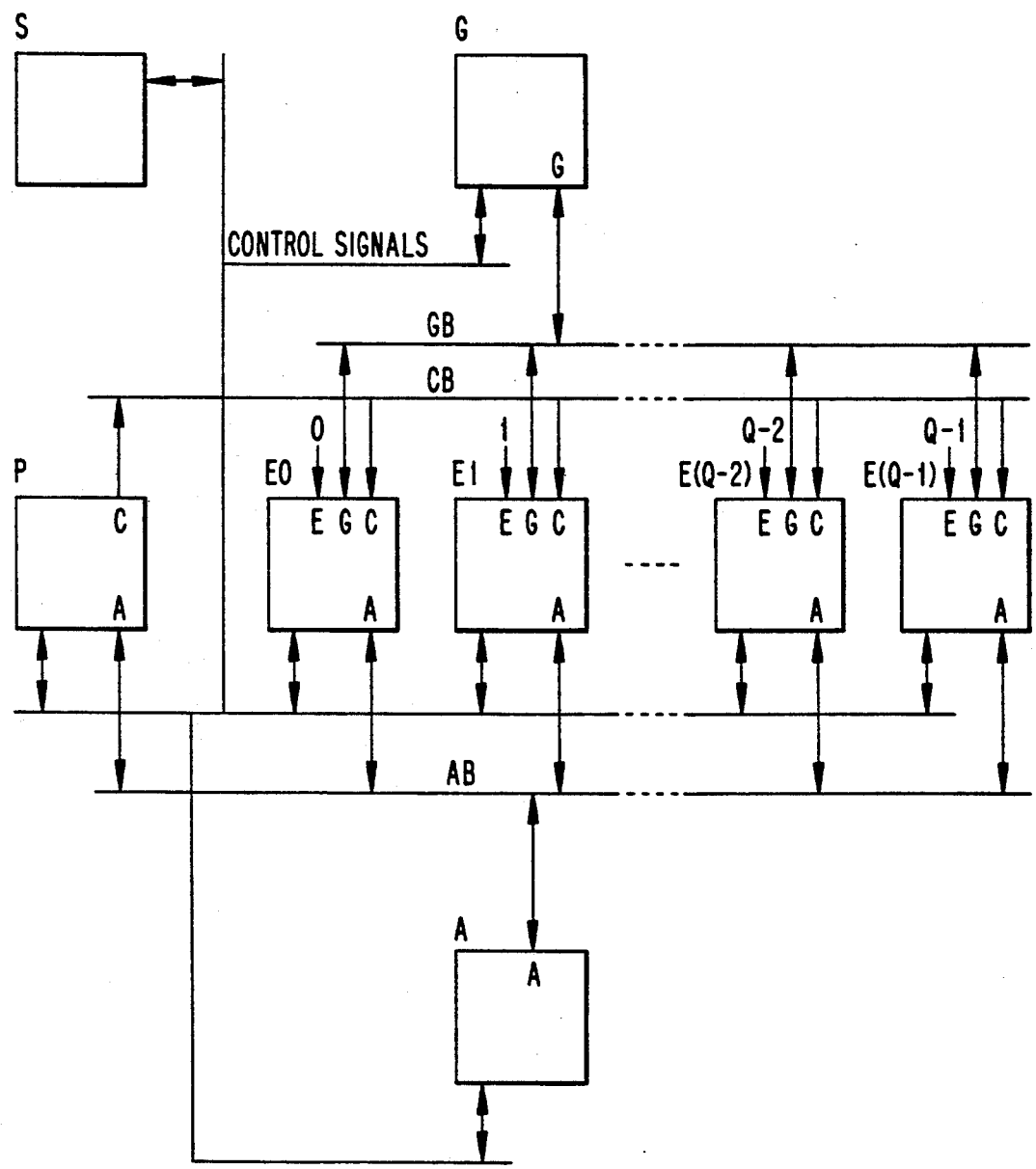
FIG. 2 is a block schematic of an embodiment of the inventive apparatus.

FIG. 2 illustrates an inventive apparatus in the form of a theorem checker comprising a sequence unit S, a generator G, a permanent unit P, an analyzer A and a plurality of evaluators E0-E(Q-1) (arithmetic units).

The sequence unit is operative to determine which stage or phase of the theorem check shall be carried out on that particular occasion. Remaining units signal their states, via buses, to the sequence unit, which determines on the basis thereof which stage or phase shall be next carried out.

The generator generates tuples of test variables. The names of the variables are transmitted to all evaluators, via a bus GB, prior to each test evaluation. A tuple is a sequence of ordered variables, for instance <A,B>.

The permanent unit includes a memory. Each address includes three words corresponding to the three variables in a triplet. Stored in the words is the value to which the variable is at present permanently instantiated, (assigns a vale to a variable). In addition to the memory, the permanent unit also includes an instantiating-part and an analysis part, among other things.

An evaluator is provided for each combination of constant values to which a tuple of test variables can be instantiated. If the value of the tuple is T, the number of evaluators will be $Q=2^T$. For example, a tuple consisting of two variables can be instantiated to <0,0>, <0,1>, <1,0>, <1,1>, and hence four evaluators are required. Each evaluator is, itself, responsible for evaluating a test case. Each of the evaluators includes a respective memory of the same kind as that in the permanent unit. Stored in the words is the value to which the variable is at present instantiated in the test. The content of the memory in the permanent unit can be copied into the memories of the evaluators, via a bus CB. In addition to the memory, the evaluator also includes, inter alia, an instantiating part, a rule-part and an analyzing-part.

The analyzer generates all pairs of variables for evaluating the tests. Addresses corresponding to the pairs are transmitted to all evaluators and to the permanent unit, via a bus AB. The pair is analyzed in these components, and the result then transmitted to the analyzer.

The format of the matrix stored in the memories in the permanent unit and the evaluators are shown in Table 1. The n first addresses are accommodated by the triplets. The address 0 contains, in particular, the triplet which corresponds to the main implication of the formula. The values of these three variables $V_{i,X}$, $V_{i,Y}$ and $V_{i,Z}$ is stored for each triplet, i. The following addresses are used for the atoms. The value i is stored in the word $A_i$ for each atom. The reason why the atoms are present is because each unique variable shall occur at least once in word 0. The last address is used to store the constant 0.

TABLE 1

| Address | Memory format | | |
|---|---|---|---|
| | Word 0 | Word 1 | Word 2 |
| 0 | $V_{0,X}$ | $V_{0,Y}$ | $V_{0,Z}$ |
| 1 | $V_{1,X}$ | $V_{1,Y}$ | $V_{1,Z}$ |
| : | : | : | : |
| n−1 | $V_{n-1,X}$ | $V_{n-1,Y}$ | $V_{n-1,Z}$ |
| n | $A_0$ | | |
| n+1 | $A_1$ | | |
| : | : | | |
| n+a−1 | $A_{a-1}$ | | |
| n+a | 0 | | |

Each word is divided into fields in accordance with Table 2. EQC denotes the equivalence class to which the variable is at present instantiated. C=1 denotes that the variable is instantiated to the constant 0. EQC then lacks significance, but is assumed to be 0. N=1 denotes that the variable is instantiated to the negation of the stated equivalence class or constant. In the following, the values are generally given as <N,C,EQC>.

| Bit | Designation Content | |
|---|---|---|
| 0–31 | EQC | Equivalence class |
| 32 | C | Constant |
| 33 | N | Negation |

TABLE 2

Word format

Assume that two variables X, Y have the values <$N_X$,$C_X$,EQC> and <$N_Y$,$C_Y$,$EQC_Y$>. The following will then apply:

X=Y (X is equal to Y) if
$N_X$=$N_Y$,$C_X$=$C_Y$,$EQC_X$=$EQC_Y$
X≠Y (X negated equal to Y) if
$N_X$≠$N_Y$,$C_X$=$C_Y$,$EQC_X$=$EQC_Y$
X=0 (X false) if $N_X$=0,$C_X$=1
X=1 (X true) if $N_X$=1, $C_X$=1

Initially, each unique variable V has a unique value <0,0,$A_V$>, where $A_V$ is the address of the location in the matrix at which V is found in word 0. The variable corresponding to the whole formula shall therefore have the value <0,0,0>. Instantiation of a variable X with the value <$N_X$,0,$EQC_X$> to a constant equal to or negated equal to another variable is effected by changing its value in accordance with the above. Since all variables which are equal or negated equal to X shall still remain equal or negated equal to X, all of these values shall be changed in a corresponding way. Consequently, instantiation implies that the values of all variables V with equivalence class $EQC_V$=$EQC_X$ are changed. Thus, the object of instantiation is more an equivalence class than a variable. Such an equivalence class is referred to in the following as a destination and the equivalence class is said to be instantiated to a value.

FUNCTION

The theorem check is divided into the following main stages or phases:
Charging
Initiation
Copying
Generation
Evaluation
Analysis
Reporting The sequence unit determines, with the aid of signals from remaining units, which of these stages shall be carried out.

3.1 CHARGING

During the charging stage, the aforedescribed matrix is transferred from an external device to the memory incorporated in the permanent part. This transfer can be effected with the aid of conventional methods and will therefore not be described here. Neither is the flow of the hardware required to effect this transfer included in the flow sheet.

3.2 INITIATION

The theorem check is initiated with an external start signal, which means that initiation has commenced. The variable which corresponds to the whole formula, or more precisely to its equivalence class, is instantiated to the constant 0 in the permanent unit.

Instantiation of an equivalence class D to a value V is effected by addressing all triplets and atoms in the sequence. When a word containing D is found, the word is changed to V.

3.3 COPYING

Copying is effected subsequent to initiation, and generally as a first stage in each test. Copying involves copying the whole of the permanent part in the matrix in all evaluators.

Copying is effected by addressing all triplets and atoms in the permanent unit in sequence. The triplet and relevant address are transferred for writing into the evaluators, via the bus CB.

3.4 GENERATION

Generation of a tuple of test variables and instantiation thereof in the evaluators is effected subsequent to copying. Each evaluator gives a unique combination of instantiations to the test variables.

The number of counters included in the generator is equal to the size, T, of the tuple. The counters determine which variables are included in the tuple at that moment. The counters are set to zero each time a permanent instantiation has taken place, since all tests must then be repeated. In other respects, the counter combination or chain is stepped forward with each generating process.

The first variable is transferred to all evaluators, via the bus GB. Each evaluator determines whether the variable shall be instantiated to the constant 0 or to the constant 1. Instantiation is then effected in parallel in all evaluators. This procedure is carried out in accordance with the same principle as that applied in the permanent unit. When all evaluators are ready, the next variable is transferred and the procedure is repeated until all variables in the tuple are instantiated. The evaluators determine the values in a manner such that the variables in the tuple obtain a unique combination of instantiations in each evaluator. Each evaluator has a unique number, for this purpose.

3.5 EVALUATION

Evaluation is effected subsequent to generation. All evaluators are operative to evaluate the matrix in parallel and independently of one another. Evaluation is carried-out in two part-stages, i.e. searching for rules which can be applied, and instantiation in accordance with these rules.

Searching is carried-out by addressing the triplets in sequence. Each triplet is examined to ascertain whether or not any instantiating rule or terminating rule is applicable. If an applicable terminating rule is found, the evaluating process is terminated and terminal is signalled. If an applicable instantiating rule is found, tee search is interrupted and instantiation is effected in accordance with the rule. If the whole of the matrix is searched without revealing an applicable rule, the evaluation process is terminated.

Instantiation is effected in accordance with the aforesaid principles, which involves a survey of all triplets. Instantiation is determined by the rule and the variables in the triplet for which the rule is applicable. Subsequent to instantiation, the search for applicable rules is commenced from the beginning.

3.6 ANALYSIS

Analysis is carried-out, when all evaluators are ready. If all evaluators signal terminal, the theorem check switches to reporting, since the formula is then logically true. In other cases, the test is evaluated.

The purpose of this evaluation is to find newly-arrived instantiations in all evaluators. The analysis unit indicates all pairs of variables in sequence, by transmitting address pairs on bus AB to all evaluators and to the permanent unit. Since all variables occur at some time in word 0 in the matrix, it suffices to analyze this word. Each evaluator and permanent unit tests whether the variable pair is equal or negated equal instantiated. The result is signalled to the analysis unit. When the pair is equal or negated equal instantiated in all evaluators, but not in the permanent unit, the pair shall be instantiated equal or negated equal respectively in the permanent unit. Instantiation is effected in the aforedescribed manner.

Because the analysis unit will also indicate the last variable in the matrix, namely the variable which is always instantiated to 0, it is guaranteed that the evaluation will cover newly-arrived instantiations to 0 and to 1.

Subsequent to having analyzed all pairs, the theorem checker switches to one of two alternative stages. If the analysis has arrived at a permanent instantiation, it is necessary to repeat all tests from the beginning. A switch is then made to copying, and the counters in the generator are set to 0. If the analysis has not lead to a permanent instantiation and all possible tests have not yet been carried out, a test shall be carried out with a new tuple of variables. A switch to copying is also made in this case. In this case, the counters in the generator are stepped forwards. If the analysis has not led to any permanent instantiation and all possible tests have been carried out, the theorem checker switches to reporting, since the formula cannot then be shown to be logically true.

3.7 REPORTING

Reporting means that only the result of the theorem check is found available in the form of a truth-signal.

4 DETAILED DESCRIPTION

4.1 CONNECTIONS

Table 3 recites all connections between various units in the theorem checker. Connections in buses are denoted with the bus name followed by a colon and the connection name in the bus. Capital letters indicate connections with more than one bit. Connections of the type wired-and are designated &. In the case of such connections, the signal is 1 solely when all transmitted units signal 1. 0 denotes communication with the surroundings.

TABLE 3

| Connections | | | |
|---|---|---|---|
| Name | From | To | Function |
| C:A | Perm | Eval | Address when copying |
| C:VX | Perm | Eval | Variable X (word 0) when copying |
| C:VY | Perm | Eval | Variable Y (word 1) when copying |
| C:VZ | Perm | Eval | Variable Z (word 2) when copying |
| G:D | Gen | Eval | Variable to be test instantiated |
| G:n | Gen | Eval | Cite number of variable in the triple |
| G:strobe | Gen | Eval | New variable transmitted |
| A:A | Anal | Eval | Address when analyzing |
| A:strobe | Anal Perm | Eval | Complete address pair transmitted |
| A:equal | Eval Perm | Anal & Perm | All evaluators but not the permanent unit has equal inst |
| A:nequal | Eval Perm | Anal & Perm | All evaluators but not the permanent unit has negated equal inst |
| start | 0 | Sequ | Start of theorem check |
| perm ready | Perm | Sequ Anal | Permanent unit is ready |
| gen ready | Gen | Sequ | The generator is ready |
| eval ready | Eval | Sequ & Gen | All evaluators are ready |
| eval term | Eval | Sequ & | All evaluators have found terminal |
| anal ready | Anal | Sequ | The analyzer is ready |
| any inst | Anal | Sequ.f | A permanent instantiation has been carried out |
| more tests | Gen | Sequ | Several tests remain |
| reset gen | Sequ | Gen | Reset the generator |
| load | Sequ | 0 | Charging stage |
| init | Sequ | Perm Gen | Initiating stage |
| copy | Sequ | Perm Eval | Copying stage |
| gen | Sequ | Gen Eval | Generating stage |
| eval | Sequ | Eval | Evaluating stage |
| anal | Sequ | Perm Eval Anal | Analysis stage |
| report | Sequ | 0 | Reporting stage |
| true | Sequ | 0 | The formula is logically true |
| N | Sequ | --- | Number of triplets |
| N+A | Sequ | --- | Number of triplets plus atoms |
| N+A+1 | Sequ | --- | Number of triplets plus atoms plus 1 |

4.2 SEQUENCE UNIT

Figure 3:
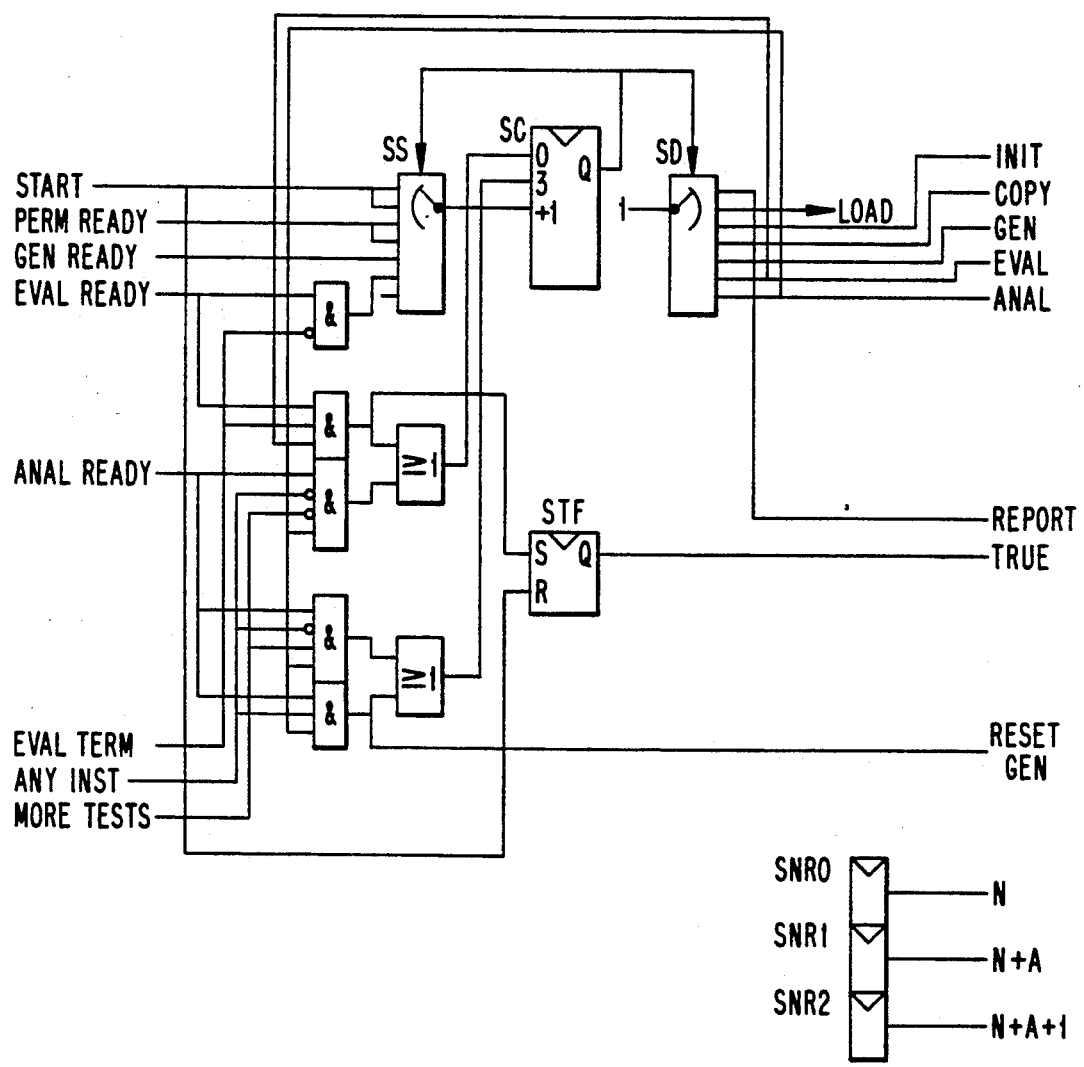
FIG. 3 is a block schematic of a sequence unit S.
Figure 18:
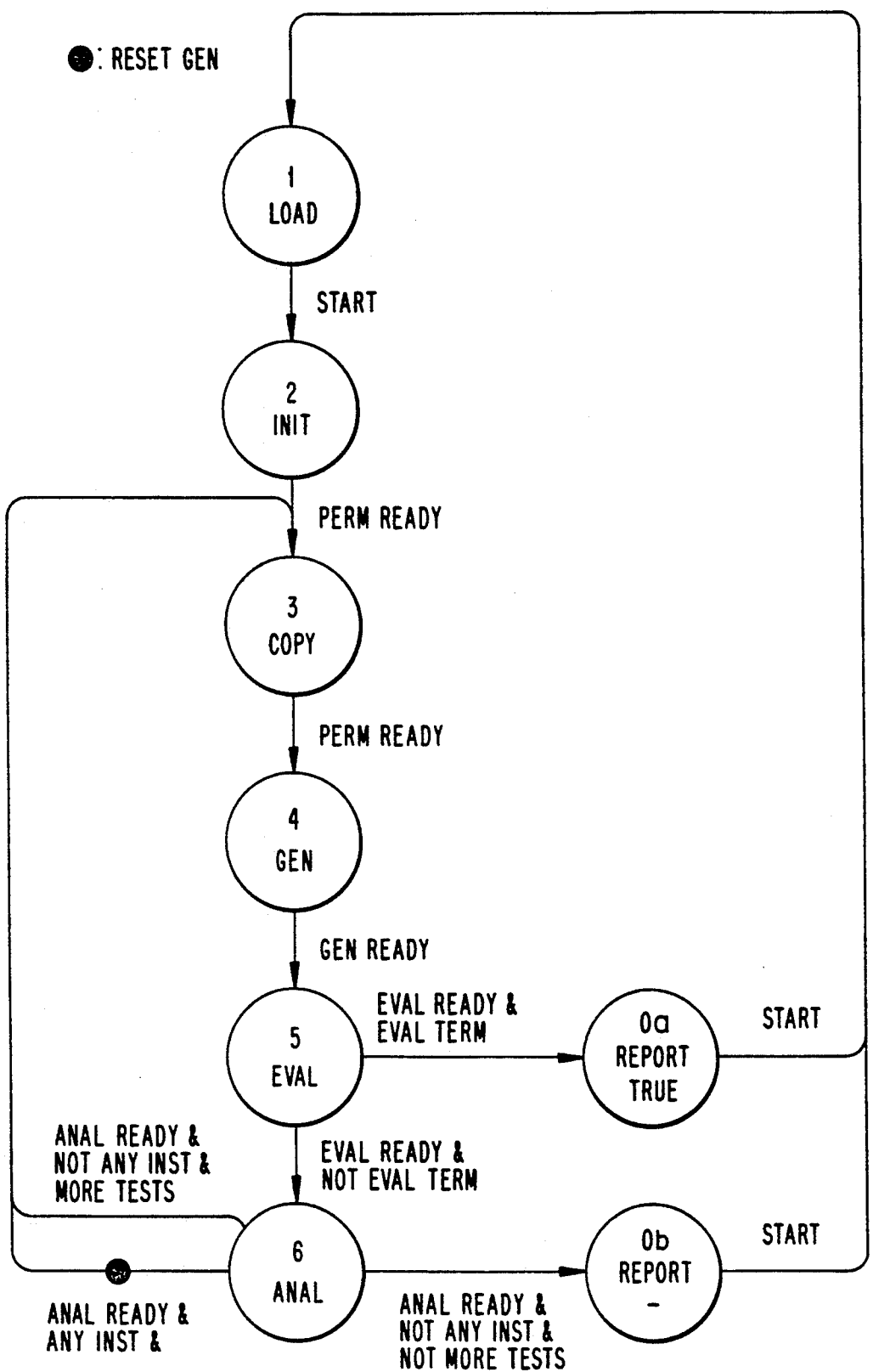
FIG. 18 is a state graph for sequence unit.

The sequence unit S shown in FIG. 3 is a finite state machine having state transitions according to FIG. 18.

The state is determined by a counter SC. The counter is decoded to seven different state signals in the decoder SD. The transition between successively coded states is effected by stepping the counter. Which of the external signals that is capable of stepping of indexing the counter will depend on the state concerned and are selected by the selector SS. The transition between non-successive coded states is effected by charging the counter with the constants 0 or 3. Which of the external signals that is capable of charging the counter will depend on the state concerned and is selected by gate logic.

A flip-flop STF stores the result of the theorem check. The flip-flop is 0-set at the beginning and is 1-set in conjunction with a transition from state 5 to state 0.

The signal "reset gen" is sent to the generator in conjunction with a transition from state 6 to state 3 when the signal "any inst" is active.

Three registers SNR0, SNR1, SNR2 contain respectively a number of triplets, N, a number of triplets plus atoms, N+A, and a number of triples plus atoms plus 1, N+A+1. These are assumed to be charged during the charging stage, which is not described here.

4.3 GENERATOR

Figure 4:
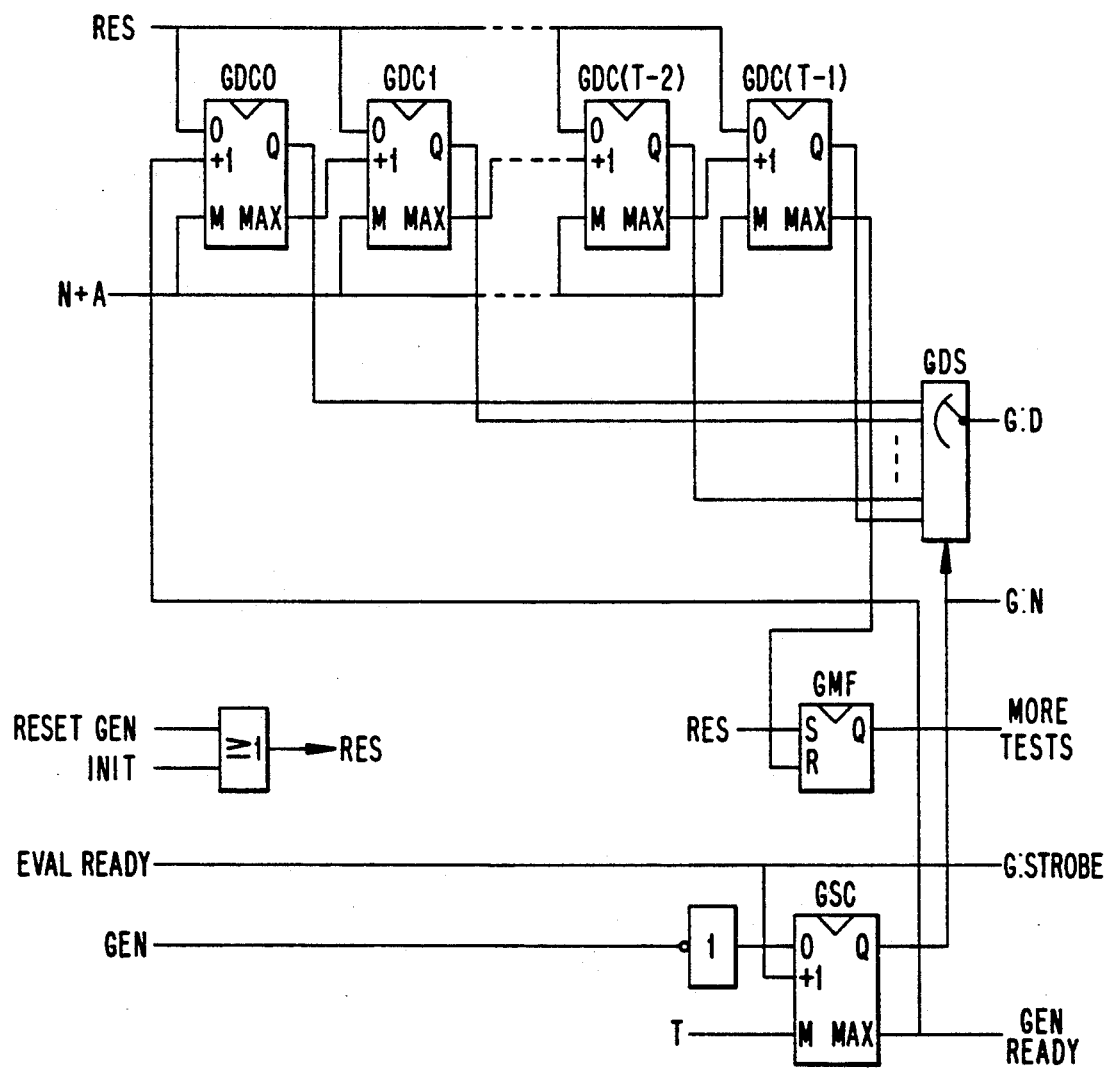
FIG. 4 is a block schematic of a generator G.

The generator G shown in FIG. 4 is active solely in the generating stage.

The unit includes a counter for each variable in the test tuple. GDC0 ... GDC(T-1), where T is the size of the tuple. Each counter counts modulo N+A. The counters are coupled in a chain, such that a counter present in the chain is stepped when a preceding counter begins again from 0.

This sequentiation is effected by a counter GSC, which counts modulo t. The counter selects one of the counters GDC0 ... GDC(T-1) via a selector GDS.

GSC has the value 0 when generating commences. GDC0 will then be selected by GDS, and the value is transmitted on "G:D". The value is interpreted in the evaluators as an equivalence class. The value of GSC is transmitted on "G:N" at the same time. When the evaluators have been instantiated in accordance With transmitted data, the generator receives the signal "eval ready", wherewith GSC is stepped. The next counter GDC1 in line will then be selected and its value transmitted. The procedure is repeated until all counters have been selected once. When the signal "eval ready" is received for the last time, GSC gives a carry-signal which steps the counter-chain GDC0 ... GDC(T-1) and sends the signal "gen ready" to the sequence unit.

The generator is reset during the initiation stage or when the signal "reset gen" is received from the sequence unit. All counters GDC0 ... GDC(T-1) are set to 0 when the generator is reset.

A flip-flop GMF indicates whether or not several tests remain. The flip-flop is set to 1 when resetting the generator and to 0 when the counter-chain GDC0 ... GDC(T-1) gives a carry-signal. The value of the flip-flop is sent to the sequence unit in the form of the signal "more tests".

4.4 PERMANENT UNIT

Figure 5:
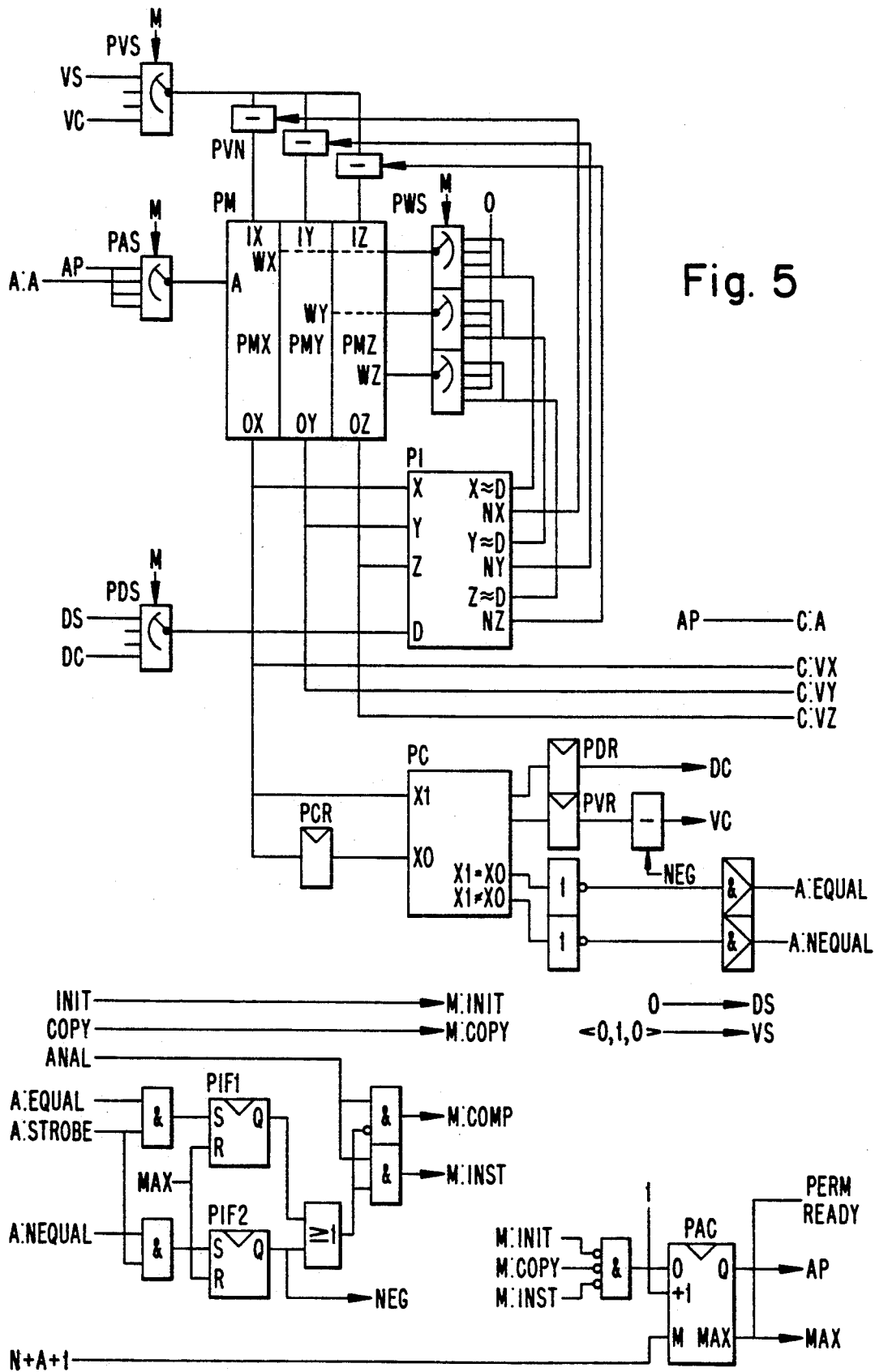
FIG. 5 is a block schematic of a permanent unit P.

The permanent unit P shown in FIG. 5 is active in the stages initiation, copying and analysis. The analysis includes two part-stages, namely comparison and instantiation.

The unit includes a matrix memory PM and an instantiation part PI and an analysis part PC.

The matrix memory is divided into three identical memories PMX, PMY, PMZ including the words 0, 1 and 2 respectively. The common address of the memories is selected by a selector PAS. Input data to all memories is selected by a selector PVS. The three memories have separate write-signals, which are selected by three parallel selectors PWS.

The instantiating part PI shown in FIG. 6 has a comparator for each memory. The three addressed words in PM are compared with a comparand or reference. When similarity occurs between a word and the comparand, a write signal is sent to a corresponding memory. The comparand is selected by a selector PDS (FIG. 5).

The analysis part PC shown in FIG. 7 is operative to compare words from the memory PMX with the immediately preceding addressed word with respect to similarity or negated similarity of the words. The words are registered in registers PDR and PVR (FIG. 5). A cross-connector PCX (FIG. 7) ensures that a word which contains a constant (C=1) will be always registered in PVR.

A counter PAC which counts modulo N+A+1 is used to address the matrix memory PM in conjunction with initiation, copying and instantiation.

Two flip-flops PIF1, PIF2 are operative to determine which of the part-stages, comparison or instantiation, shall be carried out during the analysis. These flip-flops also determine whether or not instantiation shall be effected to similarlity or negated similarity.

The selectors are activated during the various stages in accordance with Table 4.

TABLE 4

| Stage | Selection in the permanent unit. | | | |
|---|---|---|---|---|
| | PAS | PVS | PDS | PWS |
| Intiation | AP | VS | DS | WI |
| Copying | AP | — | — | 0 |
| Analysis: | | | | |
| Comparison | A:A | — | — | 0 |
| Instantiation | AP | VC | DC | WI |
| gives separate data to X, Y, Z. | | | | |

Instantiation of an equivalence class $D=EQC_D$ to a value $V=<N_V,C_V,EQC_V>$ results in a search of all triplets and atoms. This search is effected by addressing PM from a counter PAC which is stepped continuously. The words $<N_R,C_R,EQC_R>$ read-out are compared in the instantiation part PI with the comparand $EQC_D$, and not-constant, $C_R=0$, activates a write-signal corresponding to the matching word. This write-signal results in the substitution of the matching word in PM with the value $<N_R \oplus N_V,C_V,EQC_V>$, where $\oplus$ indicates the modulo-two-summation. The modulo-two-summation is effected with the aid of the negating elements PVN. A negating element, according to FIG. 8, negates a value by changing N when its control input is 1. When all triplets and atoms in PM have been addressed, a carry-signal is obtained from the counter PAC.

Initiation involves instantiation of an equivalence class 0 to the constant 0, by the method described. D and V are selected with the aid of the selectors, in accordance with the above table, where DS=0, VS=<0,1,0>. The signal 'perm ready' is sent to the sequence unit upon completion of the initiation stage.

Copying involves addressing the whole of the matrix memory PM, row for row, with the aid of the counter PAC, which is stepped continuously. The words read from the rows are sent to all evaluators on 'C:VX', 'C:VY', 'C:VZ', together with the address on 'C:A'. The signal 'perm ready' is sent to the sequence unit upon completion of the copying stage.

The two addresses of the variable pair to be compared under 'A:A' over two consecutive cycles are received during the comparison stage of the analysis process. PM is addressed with these addresses in sequence. The first addressed word $X0=<N_0,C_0,EQC_0>$ from PMX is registered in the register PCR for comparison in the analysis part PC in the next cycle with the second addressed word $X\text{-}1 = <N_1,C_1,EQC_1>$ from PMX. If the values are equal, $X1=X0$, the signal A:equal is not sent. If the values are negated equal, $X1=X0$, the signal A:nequal is not sent. The reason for the inversion is because the analysis is intended to discover similarities in the evaluators where similarities are not found in the permanent unit. The negated similarity is determined with the aid of a negating element. For the purpose of effecting possible instantiation, the equivalence class in the first addressed word is registered in register PDR and the value of the last word read-out is registered in the register PVR, provided that the first word read-out is not a constant, $C_0=1$, in which case registration is effected in reverse. This reversal of said registration is effected with the aid of selector PCX. The field N in PVR, however, is always placed equal to $N_0 \oplus N_1$. The modulo-two-summation is effected with the aid of a negating element.

The instantiating stage of the analysis is initiated by receipt of the signal 'A:equal' or 'A:nequal' in combination with the signal 'A:strobe'. The former case means that the pair last compared shall be instantiated equal, whereas the latter case means that the pair shall be instantiated negated equal. The flip-flop PIF1 or PIF2 is set to 1 in respective cases. When PDR contains $EQC_D$ and PVR contains $<N_V,C_V,EQC_V>$, $EQC_D$ shall be instantiated to $<N_V,C_V,EQC_V>$ in the former case and to $<1\ N_V,C_V,EQC_V>$ in the latter case. Negation is effected with a negating element after PVR. Instantiation is effected according to the method earlier described. The signal 'perm ready' is sent to the analysis unit upon completion of the instantiating process.

4.5 EVALUATOR

Figure 9:
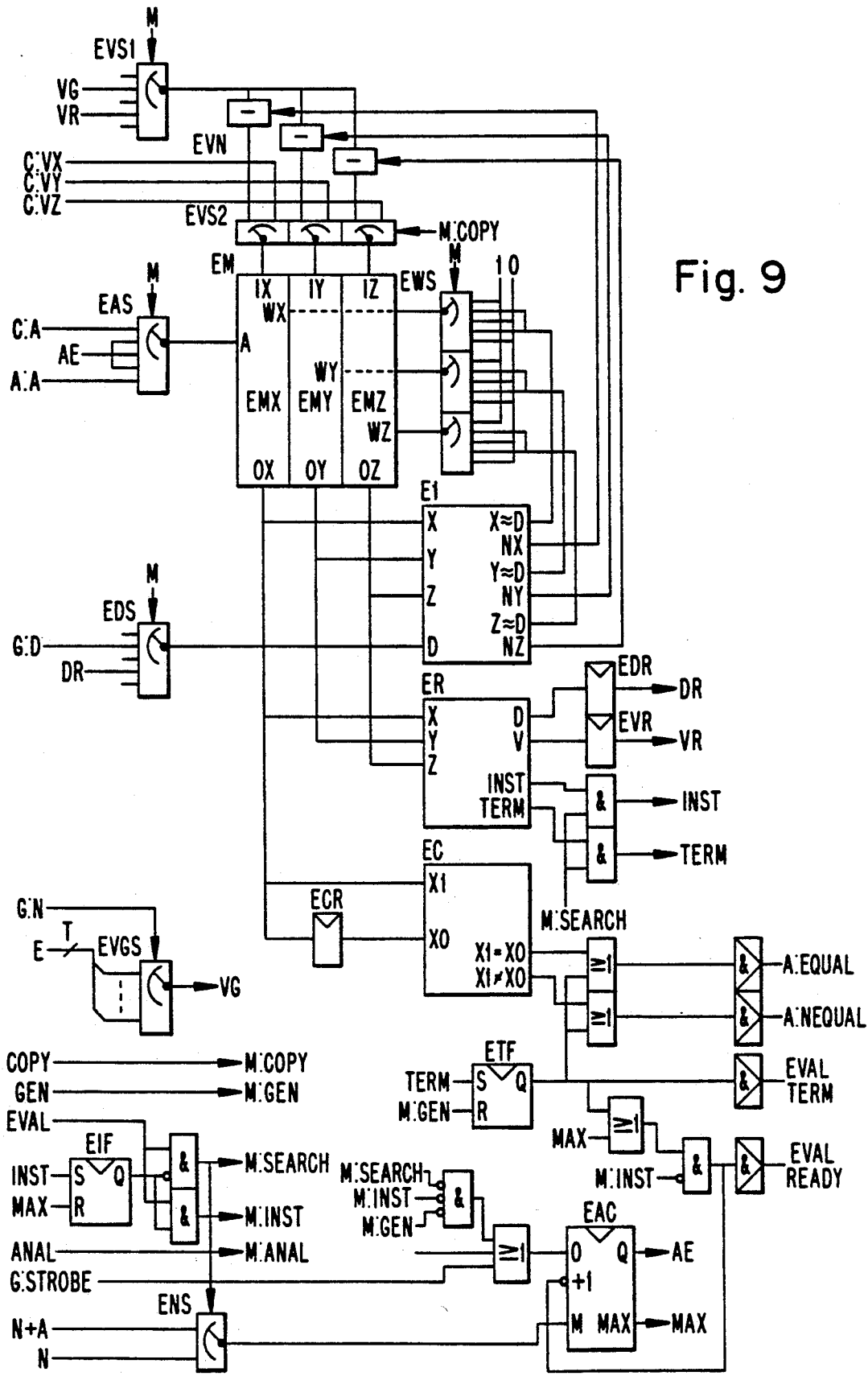
FIG. 9 is a block schematic of an instantiating part in the evaluator E.

The evaluators E according to FIG. 9 are active in the copying, generating, evaluating and analyzing stages. The evaluating stage comprises two part-stages, namely searching and instantiating.

Each unit includes a matrix memory EM, an instantiating part EI, a rule part ER and an analyzing part EC.

Similar to the memory in the permanent unit, the matrix memory is divided into three identical memories EMX, EMY, EMZ containing the words 0, 1 and 2 respectively. The common address to said memories is selected with the aid of a selector EAS. The memory input data is selected by three parallel selectors EVS2 and, when input data is common to all memories, with the aid of a selector EVS1. The three memories have separate write-signals, which are selected with the aid of three parallel selectors EWS.

Figure 10:
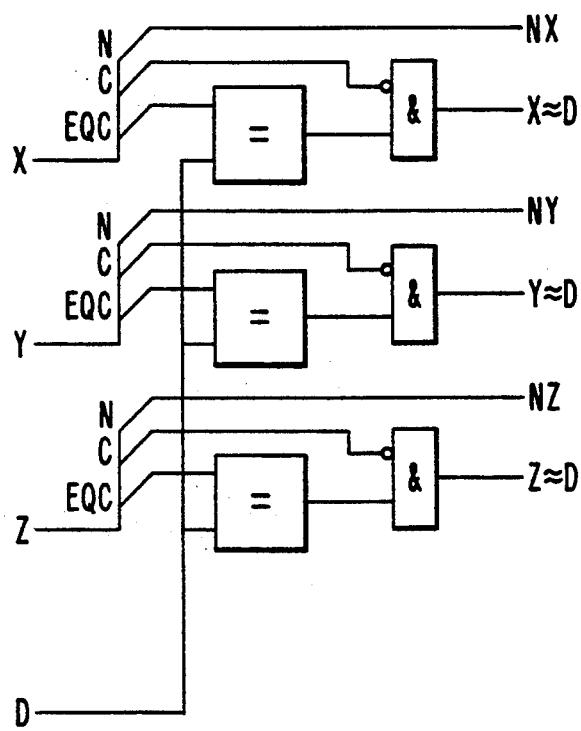

As will be seen from FIG. 10, the instantiating part has a comparator for each memory, similar to the instantiating part of the permanent unit. The three addressed words in EM are compared with a comparand. When similarity exists between a word and the comparand, a write-signal is sent to a corresponding memory. The comparand is selected with the aid of a selector EDS (FIG. 9).

Figure 12:
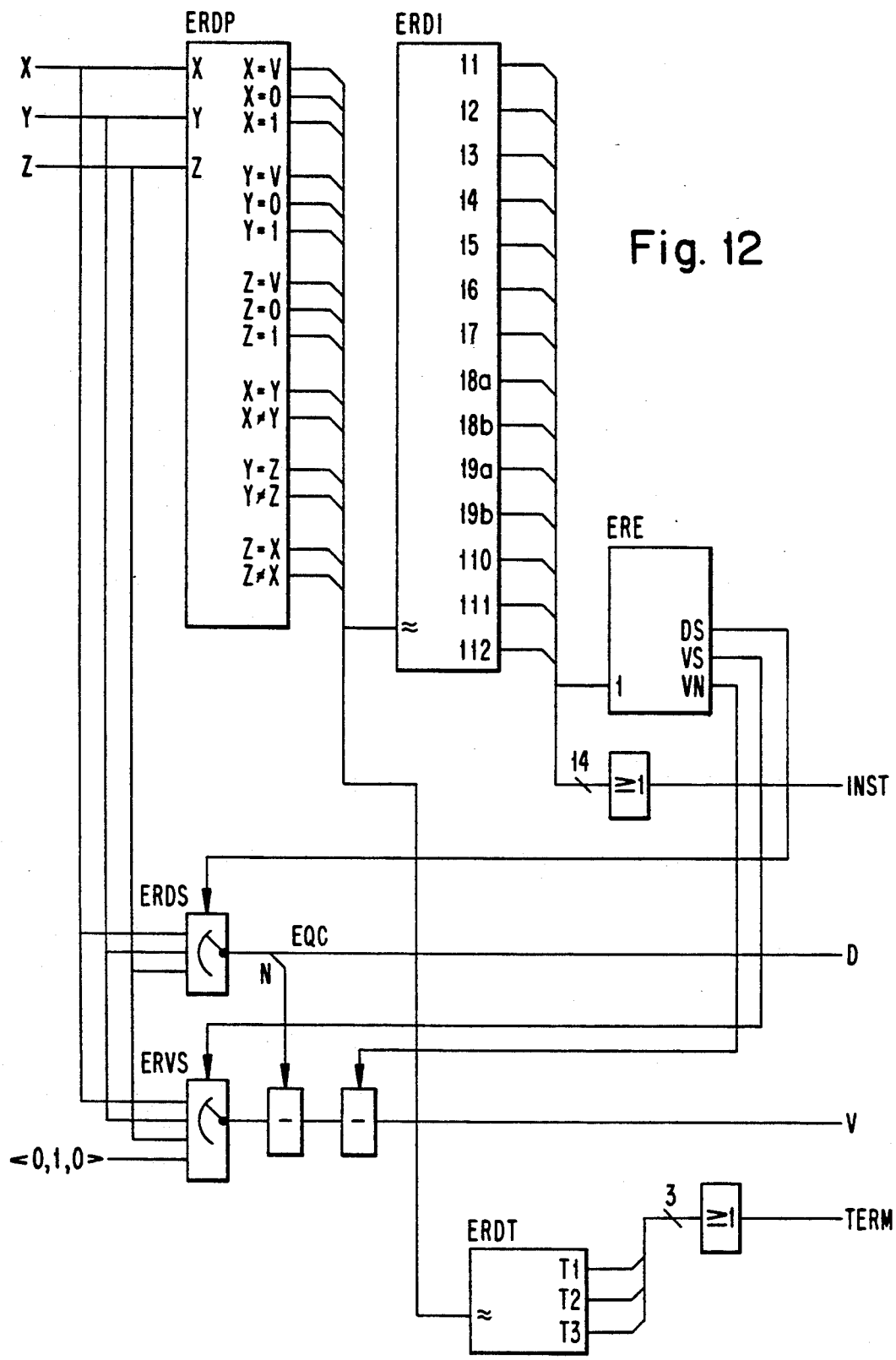
FIG. 12 is a block schematic of a rule part in the evaluator E.

The rule part ER (FIG. 12) includes a condition part ERDP, ERDI, ERDT, a conclusion part ERE and a selector part ERDS, ERVS. The condition part is operative to ascertain whether or not an addressed triplet in the matrix memory EM fulfills the condition part of a rule and if so indicates that such is the case or indicates terminal. The conclusion part ascertains, on the basis hereof, which instantiations shall be made and sets-out the selectors.

Figure 11:
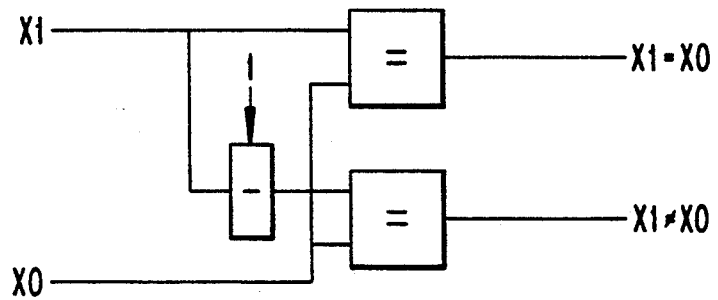
FIG. 11 is a block schematic of an analyzer part in the evaluator E.

The analysis part EC according to FIG. 11 compares addressed words from EMX with the immediately preceding addressed word, with respect to similarity or negated similarity.

A counter EAC (FIG. 9) which counts modulo N or $N+A$ is used to address EM in conjunction with generating, searching and instantiating stages.

A flip-flop EIF determines which of the part-stages, searching or instantiating, is taking place during evaluation.

The selectors are activated during the various stages in accordance with Table 5.

Instantiation of an equivalence class $D=EQC_D$ to a value $V=<N_V,C_V,EQC_V>$ involves searching all triplets and atoms. The manner of procedure is identical with instantiating in the permanent unit. EAC counts modulo $N+A$ during the instantiating stage.

When copying, triplets are received on 'C:VX', 'C:VY', 'C:VZ' together with addresses on 'C:A'. EM is addressed for each received triplet with the received address and the triplet is written-in.

TABLE 5

| | Selection in evaluators. | | | |
|---|---|---|---|---|
| Stage | EAS | EVS | EDS | EWS |
| Copying | C:A | C:V | . | 1 |
| Generating | AE | VG | G:D | WI$\epsilon$ |
| Evaluating: | | | | |
| Searching | AE | — | — | 0 |
| Inst | AE | VR | DR | WI$\epsilon$ |
| Analysis | A:A | — | — | 0 |

$\epsilon$ denotes separate data to X, Y, Z.

The variable to be instantiated, or more specifically its equivalence class, is received for each step in the generating stage on 'G:D' together with the numerical order of the variable in the tuple on 'G:N'. This numerical order, or number, steers a selector EVGS, the inputs of which consist of the numbers of respective evaluators in binary form. If the selected bit is 0, instantiation shall be effected to the constant 0, otherwise to the constant 1. The tuple or ordered sequence of variables obtains in this way a unique combination of instantiations in each evaluator. Instantiation is then effected in the aforedescribed manner. The signal 'eval ready' is sent to the generator when instantiation is completed.

Figure 13:
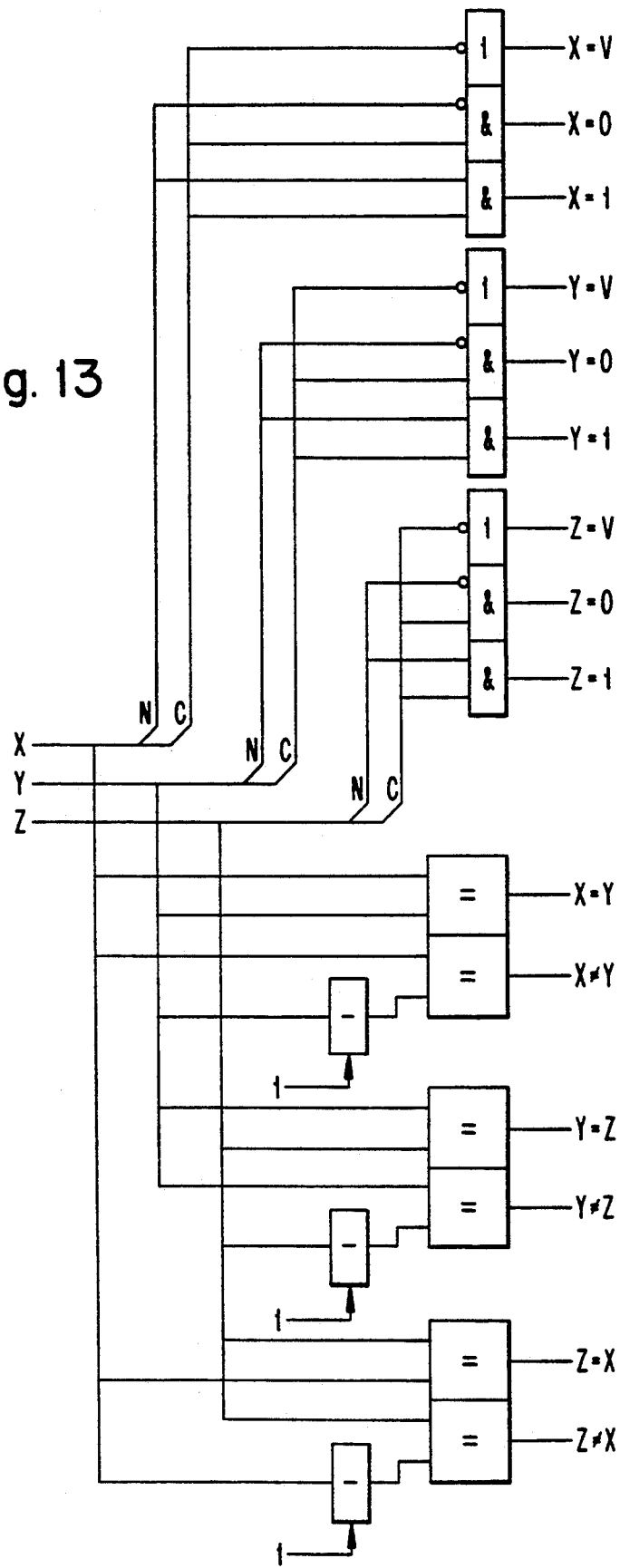
FIG. 13 is a block schematic of a predecoder.
Figure 14:
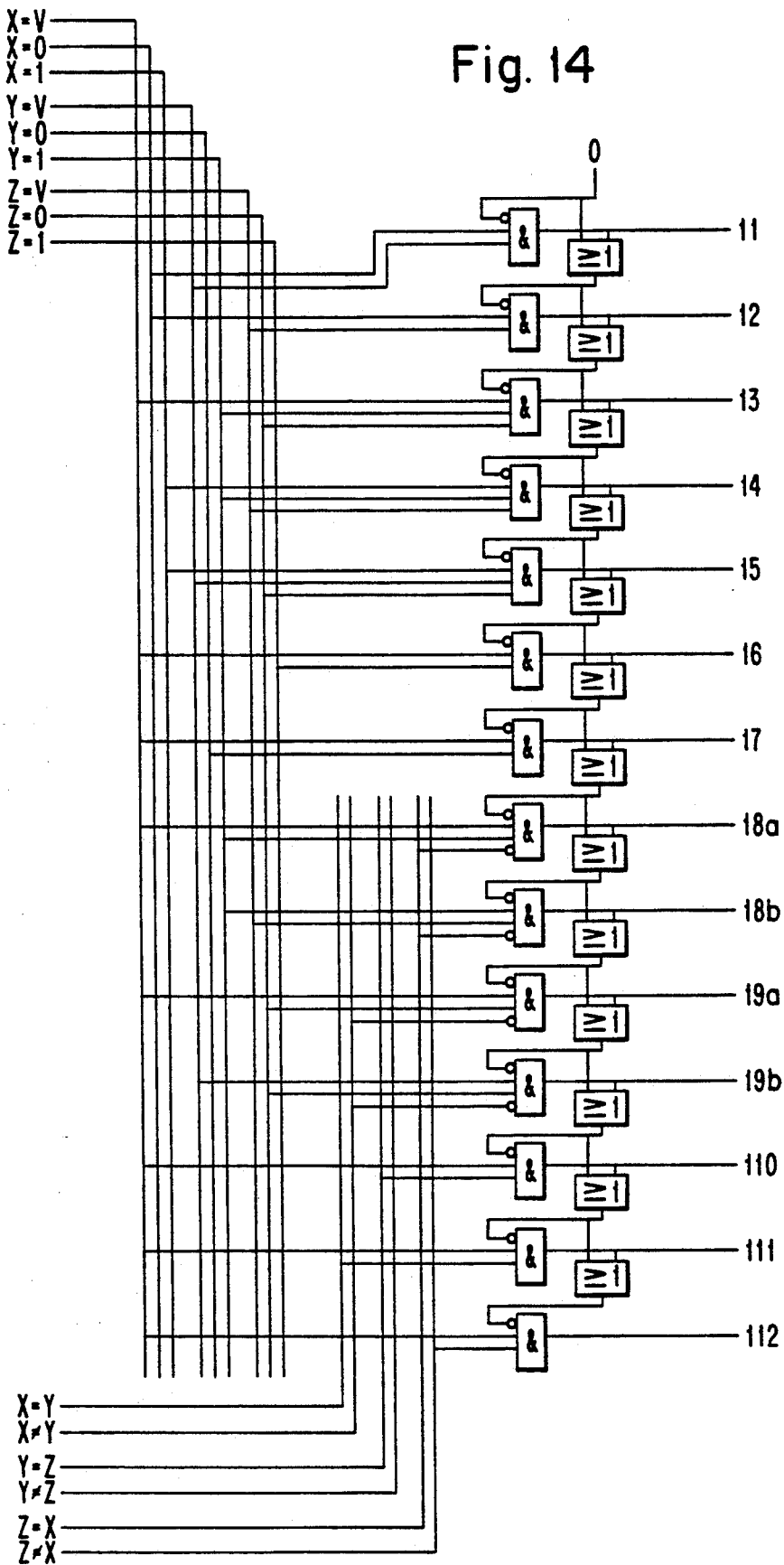
FIG. 14 is a block schematic of an instantiating decoder.
Figure 15:
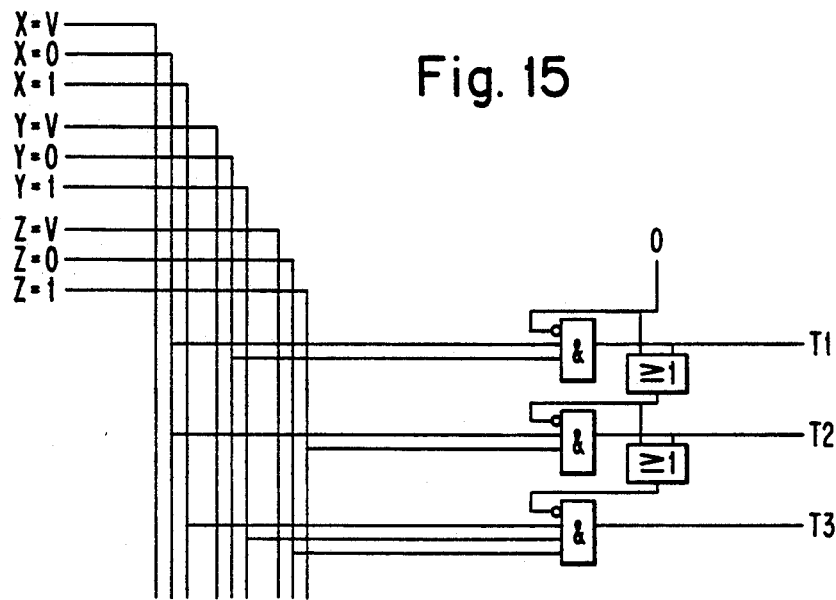
FIG. 15 is a block schematic of a terminal decoder.
Figure 16:
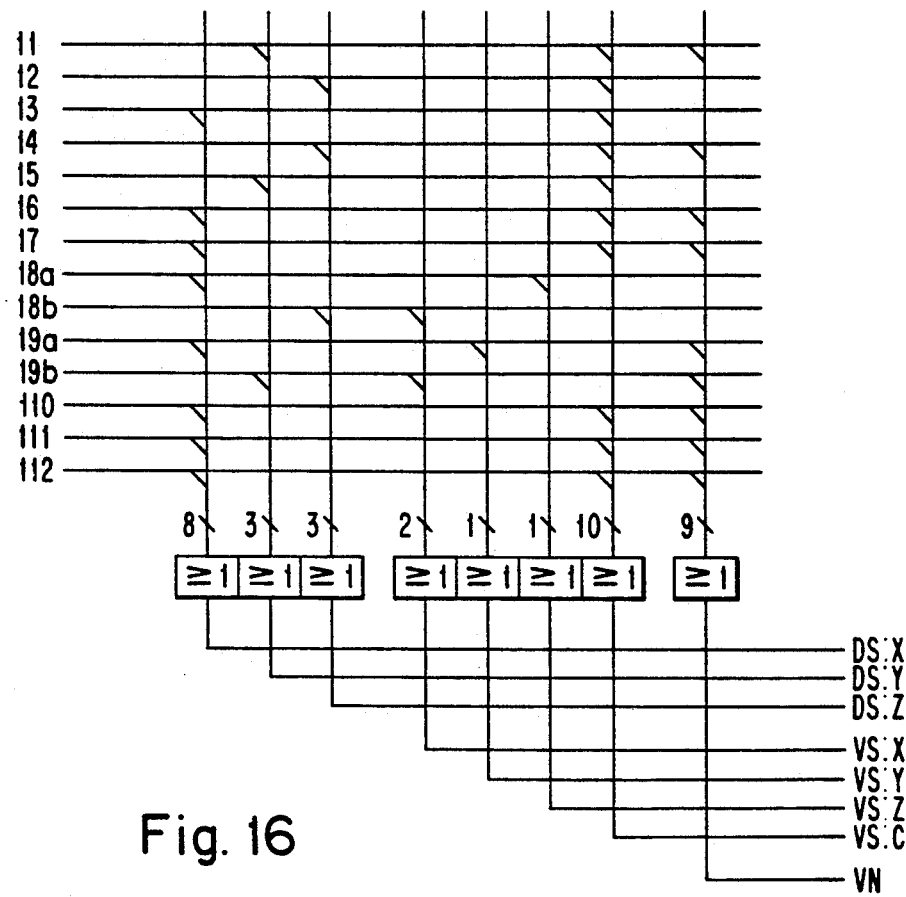
FIG. 16 is a block schematic of a conclusion part.

During the searching stage of the evaluation process, all triplets are searched until a triplet which fulfills one of the condition-parts of the rules is fulfilled. EM is addressed With EAC, which is stepped continuously. During the search, EAC counts modulo N. The words read-out are analyzed in the condition-part of the rule-part. A predecoder ERDP (FIG. 13) investigates the three addressed words individually, with respect to constant or non-constant values, and also in pairs with respect to equal or negated equal values. An instantiation decoder ERDI (FIG. 14) examines the result from ERDP with respect to whether the condition in one instantiation rule has been fulfilled or not. A summary of the conditions is given in Table 6 below. The rule is indicated when fulfillment is found. A chain of OR-gates is operative to ensure that a maximum of one indication is given. An OR-gate is operative to determine whether or not an instantation rule has been indicated. Similarly, a terminal decoder ERDT (FIG. 15) examines the result from EDRP with respect to whether or not the condition-part in a terminal rule is fulfilled. A summary of the conditions is given in Table 7 below. The rule is indicated when fulfillment is found. An OR-gate determines whether or not a terminal rule is indicated. The conclusion part ERE (FIG. 16) determines on the basis of the rule indicated in ERDI the manner in which instantiation shall be carried out. A summary of the conclusions is given in Table 6. The result is an indication of one of the words 0, 1 or 2 as the variable to be instantiated, and an indication of the words 0, 1, 2 or the constant 0 as a value of the instantiation and an indication of negation. This indication activates the selectors EDRS, ERVS which select indicated words and possibly negate the value. When the indicated variable is $<N_D,C_D,EQC_D>$, the indicated value is $<N_V,C_V,EQC_V>$, and indication of negation is designated N, the object of instantiation is the equivalence class $EQC_D$ and the indicated instantiating value $<N \oplus N_D \oplus N_V, C_1, EQC_1>$. This latter is obtained with the aid of two negating elements which negate the indicated value. The flip-flop ETF is set to 0 during the generation process. When terminal is discovered, the flip-flop ETF is set to 1 and the signal 'eval term' is sent to the sequence unit. When an applicable instantiating rule is discovered, the flip-flop EIF is set to 1, whereafter the instantiating stage of the evaluating process is commenced. If all triples in EM are searched without finding an applicable instantiating rule, the carry-signal from EAC results in the signal 'eval ready' being sent to the sequence unit.

Instantiation is effected during the instantiating-stage of the evaluating process in accordance with the result obtained from ER. The instantiating process is effected in the aforedescribed manner. Upon completion of this process, the flip-flop EIF is set to 0 and the search is repeated from the beginning.

TABLE 6

Conditions and conclusions in instantiation rules.

| | Condition | | | | | | Conclusion | | |
|---|---|---|---|---|---|---|---|---|---|
| Rule | X | Y | Z | X,Y | Y,Z | Z,X | DS | VS | VN |
| I1 | 0 | V | | | | | Y | C | 1 |
| I2 | 0 | | V | | | | Z | C | 0 |
| I3 | V | 1 | 0 | | | | X | C | 0 |
| I4 | 1 | 1 | V | | | | Z | C | 1 |
| I5 | 1 | V | 0 | | | | Y | C | 0 |
| I6 | V | | 1 | | | | X | C | 1 |
| I7 | V | 0 | | | | | X | C | 1 |
| I8a | V | 1 | | | | = | X | Z | 0 |
| I8b | | 1 | V | | | = | Z | X | 0 |
| I9a | V | | 0 | ≠ | | | X | Y | 1 |
| I9b | | V | 0 | ≠ | | | Y | X | 1 |
| I10 | V | | | | = | | X | C | 1 |
| I11 | V | | | = | | | X | C | 1 |
| I12 | V | | | | | ≠ | X | C | 1 |

V: not-constant
C: constant
=: equal
≠: negated equal

TABLE 7

Conditions in terminal rules.

| | Condition | | | | | |
|---|---|---|---|---|---|---|
| Rule | X | Y | Z | X,Y | Y,Z | Z,X |
| T1 | 0 | 0 | | | | |
| T2 | 0 | | 1 | | | |
| T3 | 1 | 1 | 0 | | | |

During the analysis, the two addresses of the variable pair to be compared are received on 'A:A' during two consecutive cycles. EM is addressed with these addresses in sequence. The first addressed word $X0 = <N_0, C_0, EQC_0>$ from EMX is registered in the register ECR and, in the next cycle, is compared in EC with the second addressed word $X1 = <N_1, C_1, EQCV_1>$ from EMX. When the values are equal, $X1 = X0$, the signal A:equal is sent. When the values are negated equal, $X1 \neq X0$, the signal A:nequal is sent. When the flip-flop ETF is set to 1, i.e. if terminal has been discovered, both A:equal and A:nequal are always sent, however.

4.6 ANALYZER

Figure 17:
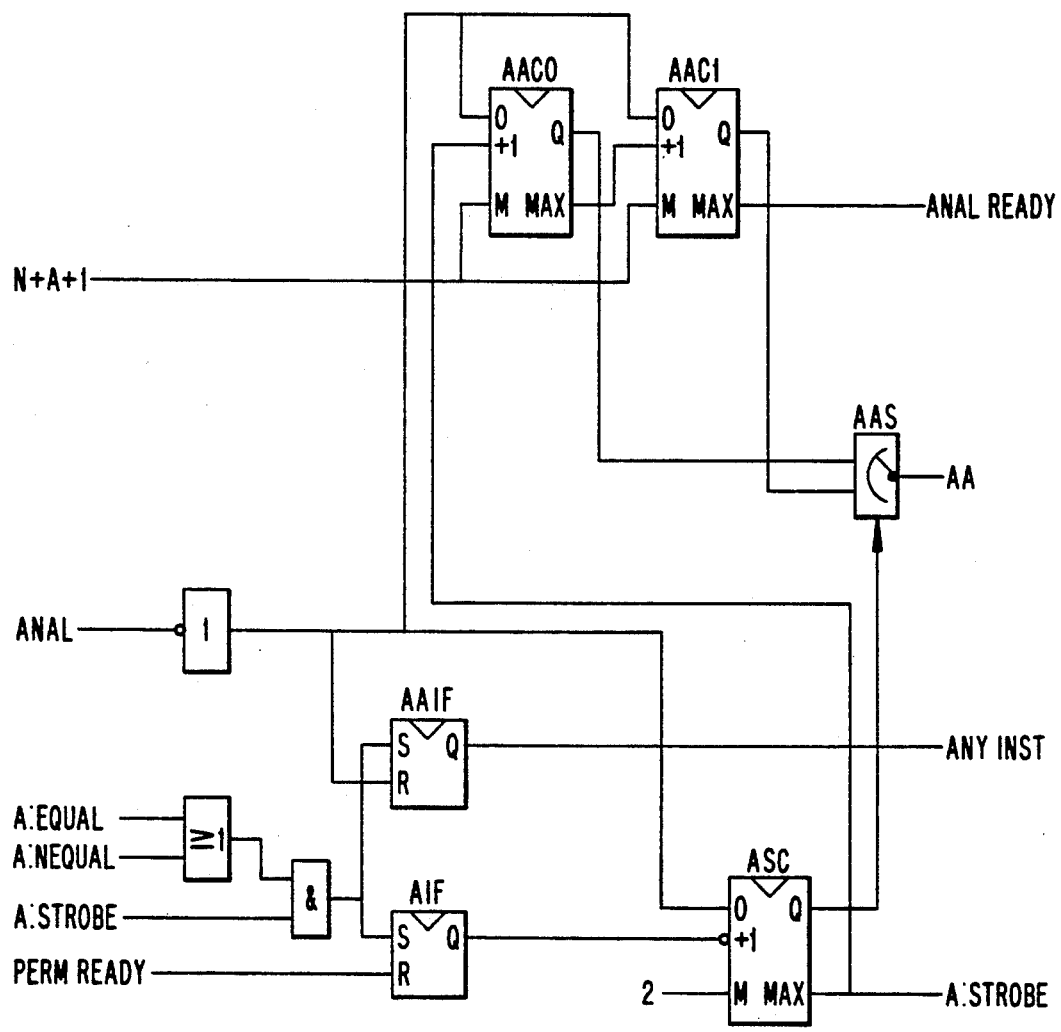
FIG. 17 is a block schematic of an analyzer A.

The analyzer A (FIG. 17) is only active in the analysis stage.

The unit includes a counter for each Variable in the pair to be analyzed, AAC0, AAC1. Each counter counts modulo $N+A$. The counters are mutually connected to form a counter-chain, such that one counter in the chain will be stepped when the preceding counter starts again from 0.

A single-bit counter ASC selects alternately one of the counters AAC0, AAC1, through a selector AAS.

A flip-flop AIF determines whether a comparison or an instantiation shall be carried out.

A flip-flop AAIF indicates whether or not an instantiation has been carried out during the analysis stage.

The flip-flop AIF is set to 0 when the analysis commences, which means that a comparison shall take place. AAIF and the counters AAC0, AAC1 are set to 0. The values on AAC0, AAC1 are sent sequentially on 'A:A', due to stepping of ASC. The fact that a complete pair has been transmitted is indicated by the signal 'A:-strobe', which is generated by the carry-signal received from ASCL. The carry-signal also causes stepping of the counter-chain AAC0, AAC1. The result of the comparisons made in the evaluators and the permanent unit is received on 'A:equal' and 'A:nequal'. If one of these is active, AIF is set to 1, whereafter initiation is effected in the permanent unit. AAIF is also set to 1, which causes the signal 'any inst' to be sent to the sequence unit. If neither 'A:equal' nor 'A:nequal' is active, the procedure is repeated for the next pair.

The analysis unit remains passive during the instantiating stage. AIF is set to 0 when the signal 'perm ready' is received from the permanent unit, whereupon the comparison procedure continues as above.

When all pairs have been examined, a carry-signal is received from the counter-chain AAC0, AAC1. This terminates the analysis stage and the signal 'anal ready' is sent to the sequence unit.

The method and apparatus can be used in practice for checking, for instance, whether the construction of an electrical system coincides with the system specification. The system solution can be described in formulae terms, which are then compared with specification formulae, thereby enabling it to be ascertained whether or not the system functions in agreement with the specification. It has long been known to translate a specification into formulae terms, see for instance "Symbolic Analysis of Relay and Switching Circuits" Trans. Amer. Inst. Elect. Eng. Volume 57, pages 713–723, 1938, Shannon, but is mentioned for the purpose of facilitating an understanding of the inventive method and apparatus.

In those instances where a need is found for a so-called counter-model, in those cases when the formula is not tautologous, the method can also be applied in a so-called "back-tracking" process, for instance in a satisfiable-check-process.

THEOREM CHECKER FOR BATCH LOGIC: DESIGNATIONS

| Designation | Operational Function |
|---|---|
| A | Analyser |
| AAC0-- | Counter-chain for indicating addresses of variables |
| AAC1 | |
| AAIF | Flip-flop for marking that an instantiation has been effected |
| AAS | Selector for selection of counter AAC0--AAC1 |
| AIF | Flip-flop for part-stage instantiation |
| ASC | Counter for AAS |
| E | Evaluator |
| EAC | Counter for internal addressing of EM |
| EAS | Selector for address of EM |
| EC | Analyser part |
| ECR | Register for delay of data to EC |
| EDR | Register for destination from ER |
| EDS | Selector for destination to EI |
| EI | Instantiating part |
| EIF | Flip-flop for part-stage instantiation |
| EM | Matrix memory |
| EMX | Memory for word 0 |
| EMY | Memory for word 1 |
| EMZ | Memory for word 2 |
| ENS | Selector for counter setting of EAC |
| ER | Rule part |
| ERDI | Instantiation decoder |
| ERDP | Predecoder |
| ERDS | Selector destination from ER |
| ERDT | Terminal decoder |
| ERE | Conclusion part |
| ERVS | Selector for value from ER |
| EVGS | Selector for value according to generator |
| EVN | Negating element for value of EM |
| EVR | Register for value from ER |
| EVS1 | Selector 1 for value of EM |
| EVS2 | Selector 2 for value of EM |
| EWS | Selector for write-signals to EM |
| G | Generator |
| GDC0-- GDC(T-1) | Counter-chain for destinations |
| GDS | Selector for selection of counter GDC0--GDC(T-1) |
| GMF | Flip-flop for marking remaining tests |
| GSC | Counter for GDS |
| P | Permanent unit |
| PAC | Counter for internal addressing of PM |
| PAS | Selector for address of PM |
| PC | Analyser part |
| PCR | Register for delaying data to PC |
| PCX | Cross-switch between destination and value |
| PDR | Register for destination from PC |
| PDS | Selector for destination to PI |
| PI | Instantiating part |
| PIF1 | Flip-flop 1 for part-stage instantiation |
| PIF2 | Flip-flop 2 for part-stage instantiation |
| PM | Matrix memory |
| PMX | Memory for word 0 |
| PMY | Memory for word 1 |
| PMZ | Memory for word 2 |
| PVN | Negating element for value to EM |
| PVR | Register for value from PC |
| PVS | Selector for value to PM |
| PWS | Selector for write-signals to PM |
| S | Sequence unit |
| SC | Stage counter |
| SD | Stage decoder4 |
| SS | Selector for stepping SC |
| STF | Flip-flop for marking a truth formula |
| SNR0 | Register for the number of triplets |
| SNR1 | Register for the number of triplets plus atoms |
| SNR2 | Register for the number of triplets plus atoms plus 1 |

I claim:

1. An apparatus for determining, in tautology checks, whether or not all possible assignments of truth values 0 and 1 to variables in a boolean formula render the boolean formula true, said apparatus comprising:

a sequence unit which is responsive to information received from all remaining connected units to determine which state in a series of stages shall be carried out;

a generator which is connected to the sequence unit via communication buses and which is operative to generate triplets from the boolean formula;

a permanent unit including an addressable memory facility for storing at each memory address words which correspond to variables in a triplet;

a plurality of evaluators, the number of evaluators corresponding to the number of combinations of constant values to which a tuple of test-variables can be instantiated, each evaluator dedicated to processing a corresponding one of the combinations of constant values to which a tuple of test variables can be instantiated, each said evaluator including an addressable memory matrix for storing at each memory address words which correspond to variables in a triplet, the addressable memory matrix comprising three substantially identical addressable memory units, each said memory unit having a data input port coupled to receive a corresponding one of the variables in a triplet, an address input port coupled to an address source that is common to all said three memory units, and a white control input coupled through a selector to receive a write control signal derived from a comparison of a comparand and a word contained at an address of the memory unit; and an analyzer, connected to said permanent unit and to said evaluators, and operative to generate pairs of addresses corresponding to variables for evaluation, wherein said addresses are sent to all evaluators and to the permanent unit via a bus, whereafter analysis of a pair is carried out in said evaluators and said permanent unit to produce results that are sent to said analyzer.

2. Apparatus according to claim 1, wherein the permanent unit includes, in addition to said addressable memory facility, an initiating part for instantiating variables according to simple instantiation rules and test instantiations to produce a result, and an analysis part for analyzing the result of each test instantiation.

3. Apparatus according to claim 1, wherein each of said evaluators includes, in addition to said memory matrix, an instantiating part for instantiating variables according to simple instantiation rules and test instantiations to produce a result, a rule part and an analysis part for analyzing the result of each test instantiation.

4. An apparatus for determining whether or not a system operates in accordance with a specification for said system, said apparatus comprising:

means for inputting a third boolean formula generated from first and second boolean formulas, the first boolean formula representing said system, and the second boolean formula representing said specification for said system;

means for converting the third boolean formula into a plurality of triplets;

evaluating means for evaluating whether or not one of said triplets is a terminal, the evaluating means including:

checking means for checking the triplets by applying predetermined, simple instantiation rules and if said simple instantiation rules cannot be applied to said triplets, then checking the triplets by test-instantiation of truth values 1 and 0; and an addressable memory matrix for storing at each memory address words which correspond to variables in one of said triplets, the addressable memory matrix comprising three substantially identical addressable memory units, each said memory unit having a data input port coupled to receive a corresponding one of the variables in said triplet, an address input port coupled to an address source that is common to all said three memory units, and a write control input coupled through a selector to receive a write control signal derived from a comparison of a comparand and a word contained at an address of the memory unit; and signalling means for signalling that the third boolean formula is tautologous in response to one of said triplets being a terminal, said tautology being indicative that the system operates in accordance with the specification for the system.

* * * * *